United States Patent
Naka et al.

(10) Patent No.: US 8,487,802 B2
(45) Date of Patent: Jul. 16, 2013

(54) COMPARATOR AND ANALOG-TO-DIGITAL CONVERTER

(75) Inventors: Junichi Naka, Osaka (JP); Masakazu Shigemori, Osaka (JP)

(73) Assignee: Panasonic Corporation, Osaka (JP)

( * ) Notice: Subject to any disclaimer, the term of this patent is extended or adjusted under 35 U.S.C. 154(b) by 280 days.

(21) Appl. No.: 13/052,817

(22) Filed: Mar. 21, 2011

(65) Prior Publication Data

US 2011/0169681 A1    Jul. 14, 2011

Related U.S. Application Data

(63) Continuation of application No. PCT/JP2009/002368, filed on May 28, 2009.

(30) Foreign Application Priority Data

Dec. 2, 2008 (JP) .................................. 2008-307426

(51) Int. Cl.
    *H03M 1/34* (2006.01)
(52) U.S. Cl.
    USPC .......................................... 341/158; 341/155
(58) Field of Classification Search
    USPC .................. 341/155, 143, 172, 158
    See application file for complete search history.

(56) References Cited

U.S. PATENT DOCUMENTS

| | | | |
|---|---|---|---|
| 5,032,744 A | 7/1991 | Wai Yeung Liu | |
| 5,164,728 A | 11/1992 | Matsuzawa et al. | |
| 5,436,939 A * | 7/1995 | Co et al. | 375/376 |
| 5,625,308 A | 4/1997 | Matsumoto et al. | |
| 6,377,100 B1 * | 4/2002 | Fujieda | 327/262 |
| 6,437,608 B1 * | 8/2002 | Miyabe et al. | 327/96 |
| 6,522,179 B2 * | 2/2003 | Ferianz | 327/108 |
| 6,753,801 B2 * | 6/2004 | Rossi | 341/161 |
| 7,061,419 B2 | 6/2006 | Sushihara et al. | |
| 2003/0048213 A1 | 3/2003 | Sushihara et al. | |
| 2004/0036453 A1 * | 2/2004 | Rossi | 323/242 |
| 2006/0055578 A1 | 3/2006 | Sushihara et al. | |
| 2012/0086488 A1 * | 4/2012 | Willey | 327/175 |

FOREIGN PATENT DOCUMENTS

| | | |
|---|---|---|
| JP | 2001-267895 | 9/2001 |
| JP | 2002-237743 | 8/2002 |
| JP | 2006-087064 | 3/2006 |

* cited by examiner

*Primary Examiner* — Peguy Jean Pierre

(74) *Attorney, Agent, or Firm* — McDermott Will & Emery LLP

(57) ABSTRACT

Increase of power consumption is reduced, and the operational speed is improved. A comparator includes a comparing section which outputs a result of comparison between a first voltage and a second voltage which constitute an input differential signal, a first positive feedback section which operates in synchronism with a first clock signal, amplifies the result from the comparing section, and outputs the amplified result to an output node pair, and a second positive feedback section which operates in synchronism with a second clock signal, and provides positive feedback to the output node pair.

11 Claims, 6 Drawing Sheets

COMPARATOR AND ANALOG-TO-DIGITAL CONVERTER

CROSS-REFERENCE TO RELATED APPLICATION

This is a continuation of PCT International Application PCT/JP2009/002368 filed on May 28, 2009, which claims priority to Japanese Patent Application No. 2008-307426 filed on Dec. 2, 2008. The disclosures of these applications including the specifications, the drawings, and the claims are hereby incorporated by reference in its entirety.

BACKGROUND

The technology disclosed in this specification relates to a comparator which receives a differential input signal pair, and performs a comparison operation with respect to a differential voltage across the differential input signal pair in synchronism with a clock signal.

In recent years, as the speed of information communication increases, and the speed and the capacity of optical disk pickups increase, there has been a need for high speed and wide input bandwidth analog-to-digital converters (ADCs), further having reduced areas and reduced power consumption for cost reduction.

FIG. 6 shows an example configuration of a dynamic comparator used for a comparator included in a high speed and low power consumption ADC. The comparator shown in FIG. 6 includes an input transistor section 10 having NMOS transistors m0a and m0b, and a positive feedback section (cross-coupled inverter latch section) 20 having NMOS transistors m1a and m1b and PMOS transistors m3a and m3b.

The gate terminals of the transistors m1a and m3a and the drain terminal of the transistor m3b are coupled to an output terminal q, and the gate terminals of the transistors m1b and m3b and the drain terminal of the transistor m3a are coupled to an output terminal qb.

An NMOS transistor m2a is coupled between the drain terminals of the NMOS transistor m1a and the PMOS transistor m3a; and the NMOS transistor m2a operates as a switch in synchronism with a clock signal CLK. An NMOS transistor m2b is coupled between the drain terminals of the NMOS transistor m1b and the PMOS transistor m3b; and the NMOS transistor m2b operates as a switch in synchronism with the clock signal CLK.

The source terminals of the PMOS transistors m3a and m3b are coupled to a power supply VDD. A PMOS transistor m4a is coupled between the drain terminal of the PMOS transistor m3a and the power supply VDD; and the PMOS transistor m4a operates as a switch in synchronism with the clock signal CLK. A PMOS transistor m4b is coupled between the drain terminal of the PMOS transistor m3b and the power supply VDD; and the PMOS transistor m4b operates as a switch in synchronism with the clock signal CLK.

The gate terminal of the NMOS transistor m0a is coupled to the positive terminal "ia" of a differential input signal pair; the source terminal is coupled to a reference potential VSS; and the drain terminal is coupled to the source terminal of the NMOS transistor m1a. The gate terminal of the NMOS transistor m0b is coupled to the negative terminal "ib" of the differential input signal pair; the source terminal is coupled to the reference potential VSS; and the drain terminal is coupled to the source terminal of the NMOS transistor m1b.

The gate terminals of the NMOS transistor m2a and m2b, and the gate terminals of the PMOS transistor m4a and m4b are coupled to the clock signal CLK.

The input transistor section 10 outputs a result of comparison between the positive terminal ia and the negative terminal ib of the differential input signal pair, to the positive feedback section 20.

When the clock signal CLK is at or above a predetermined level (hereinafter referred to as "High"), the PMOS transistors m4a and m4b open (turn off), and the NMOS transistors m2a and m2b conduct (turn on); thus, the positive feedback section 20 amplifies the result of comparison output from the input transistor section 10, holds the amplified result, and outputs the amplified result as digital signals to the output terminals q and qb.

When the clock signal CLK is at or below a predetermined level (hereinafter referred to as "Low"), the PMOS transistors m4a and m4b conduct (turn on), and the voltages of the output terminals q and qb are set to the power supply voltage VDD, that is, reset to High. In addition, the NMOS transistors m2a and m2b open (turn off), thereby causing the current paths to be disconnected, and thus no power to be consumed.

Thus, such a dynamic comparator is advantageous in that the power consumption is reduced. This field of technology is described in, for example, Japanese Patent Publications Nos. H04-043718 and 2003-158456.

SUMMARY

Here, the operation of the dynamic comparator shown in FIG. 6 will be outlined using FIG. 7.

The clock signal CKL repeatedly alternates between High and Low with a fixed period or with an irregular period. When the clock signal CLK is High, the input transistor section outputs a result of comparison with respect to the differential voltage between the positive terminal ia and the negative terminal ib of the differential input signal pair to the positive feedback section, and then the positive feedback section amplifies the result of comparison; thus, if ia>ib, then the comparator outputs q=High and qb=Low, while if ia<ib, then the comparator outputs q=Low and qb=High. Meanwhile, when the clock signal CLK is Low, the comparator outputs q=qb=High.

The operational speed of the dynamic comparator depends on the drive capability of the input transistor section, on the operating current of the comparator which depends on both the On resistance of each transistor included in the comparator and the power supply voltage, and on the output load capacitances of the output terminals q and qb of the comparator. That is, the operational speed can be increased by a high drive capability of the input transistor section, a high operating current of the comparator, and low output load capacitances. However, if the size of the input transistor section is increased to increase the drive capabilities of the transistors, then the operational speed is limited due to an increase in the self-capacitance, the occupied area is increased, and the input capacitance is increased. In addition, if the transistor size of each section is increased to increase the operating current of the comparator, then the operational speed is limited due to increases in the self-capacitance and the output load capacitances, and the occupied area is increased.

A comparator according to an example embodiment of the present invention includes a comparing section (10) configured to output a result of comparison between a first voltage (ia) and a second voltage (ib) which constitute an input differential signal, a first positive feedback section (20) configured to operate in synchronism with a first clock signal (CLK), to amplify the result from the comparing section (10), and to output the amplified result to an output node pair (q and qb), and a second positive feedback section (100 or 200)

configured to operate in synchronism with a second clock signal (CLKBST or CLKBST_B), and to provide positive feedback to the output node pair (q and qb).

According to a comparator of an example embodiment of the present invention, a small potential difference within the output node pair (q and qb) is also amplified by positive feedback of a second positive feedback section (100 or 200) other than the positive feedback of the first positive feedback section (20); thus, the potentials of the output node pair (q and qb) vary rapidly. Accordingly, an increase in power consumption can be reduced, and at the same time, the operational speed of the comparator can be improved. In addition, an ADC using the comparators of the present invention allows the frequency range of a clock signal to be wider than that of conventional ADCs.

DETAILED DESCRIPTION

Figure 1A:
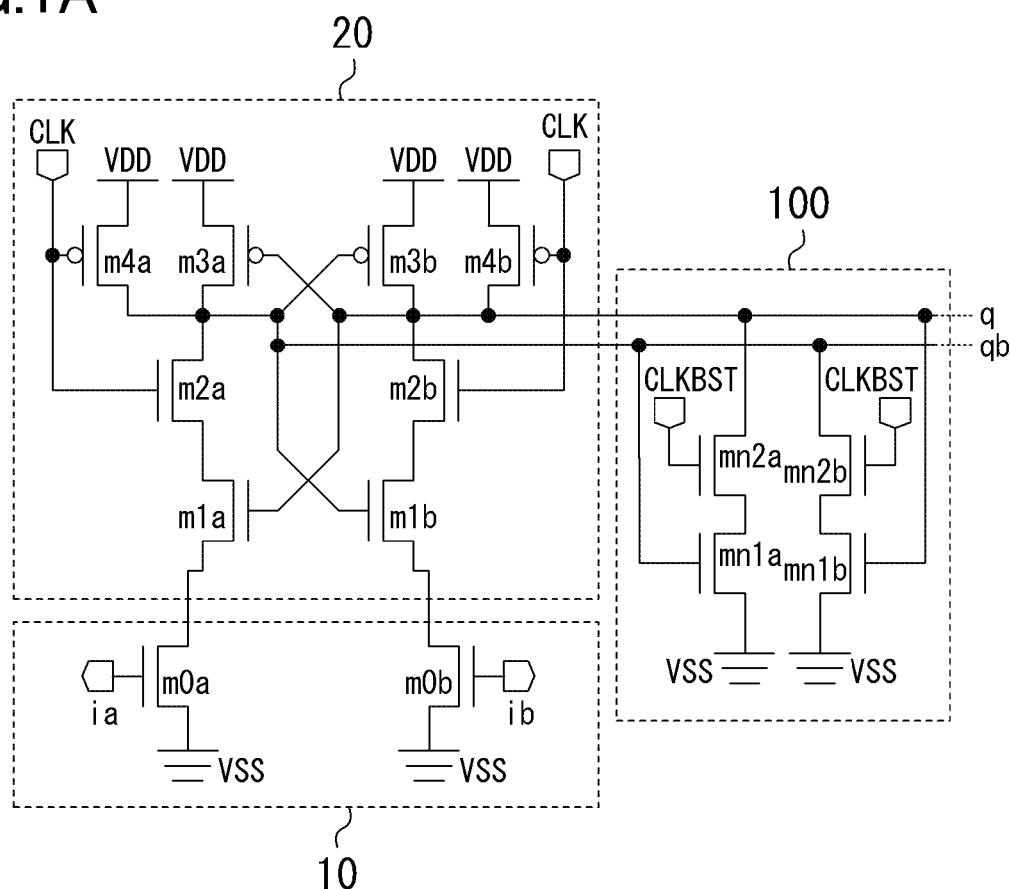
FIG. 1A is a diagram illustrating a configuration of a dynamic comparator according to the first embodiment.

Example embodiments of the present invention will be described below in detail with reference to the drawings, in which like reference characters indicate the substantially same components.

First Embodiment

FIG. 1A illustrates a configuration of a dynamic comparator according to the first embodiment. This dynamic comparator includes an input transistor section 10 having NMOS transistors m0a and m0b, a positive feedback section (cross-coupled inverter latch section) 20 having NMOS transistors m1a and m1b and PMOS transistors m3a and m3b, and a fast inverter 100.

The gate terminals of the transistors m1a and m3a and the drain terminal of the transistor m3b are coupled to an output terminal q, and the gate terminals of the transistors m1b and m3b and the drain terminal of the transistor m3a are coupled to an output terminal qb.

An NMOS transistor m2a is coupled between the drain terminals of the NMOS transistor m1a and the PMOS transistor m3a; and the NMOS transistor m2a operates as a switch in synchronism with a clock signal CLK. An NMOS transistor m2b is coupled between the drain terminals of the NMOS transistor m1b and the PMOS transistor m3b; and the NMOS transistor m2b operates as a switch in synchronism with the clock signal CLK.

The source terminals of the PMOS transistors m3a and m3b are coupled to a power supply VDD. A PMOS transistor m4a is coupled between the drain terminal of the PMOS transistor m3a and the power supply VDD; and the PMOS transistor m4a operates as a switch in synchronism with the clock signal CLK. A PMOS transistor m4b is coupled between the drain terminal of the PMOS transistor m3b and the power supply VDD; and the PMOS transistor m4b operates as a switch in synchronism with the clock signal CLK.

The gate terminal of the NMOS transistor m0a is coupled to the positive terminal "ia" of a differential input signal pair; the source terminal is coupled to a reference potential VSS; and the drain terminal is coupled to the source terminal of the NMOS transistor m1a. The gate terminal of the NMOS transistor m0b is coupled to the negative terminal "ib" of the differential input signal pair; the source terminal is coupled to the reference potential VSS; and the drain terminal is coupled to the source terminal of the NMOS transistor m1b.

The gate terminals of the NMOS transistor m2a and m2b, and the gate terminals of the PMOS transistor m4a and m4b are coupled to the clock signal CLK.

The fast inverter 100 includes NMOS transistors mn1a, mn1b, mn2a, and mn2b. The gate terminal of the NMOS transistor mn1a is coupled to the output terminal qb; the source terminal is coupled to the reference potential VSS; and the drain terminal is coupled to the source terminal of the NMOS transistor mn2a. The gate terminal of the NMOS transistor mn2a is coupled to a clock signal CLKBST; and the drain terminal is coupled to the output terminal q. The gate terminal of the NMOS transistor mn1b is coupled to the output terminal q; the source terminal is coupled to the reference potential VSS; and the drain terminal is coupled to the source terminal of the NMOS transistor mn2b. The gate terminal of the NMOS transistor mn2b is coupled to the clock signal CLKBST; and the drain terminal is coupled to the output terminal qb.

Figure 1B:
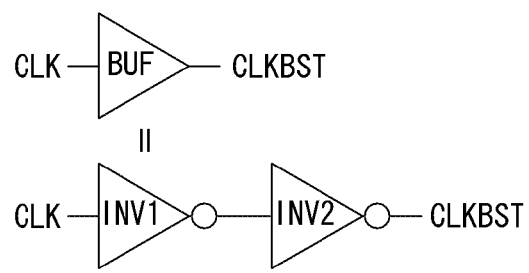
FIG. 1B is a diagram illustrating an example configuration of the clock generation circuit.

FIG. 1B is a diagram illustrating an example configuration of the clock generation circuit for generating a clock signal of the dynamic comparator of FIG. 1A. The clock generation circuit provides the clock signal CLK to the input of a buffer circuit BUF, and obtains the clock signal CLKBST. Alternatively, the buffer circuit BUF can be implemented by cascading inverters INV1 and INV2. Thus, the clock signal CLKBST has the same phase as that of the clock signal CLK, and has a delay ($\Delta t$) with respect to the clock signal CLK.

Figure 3:
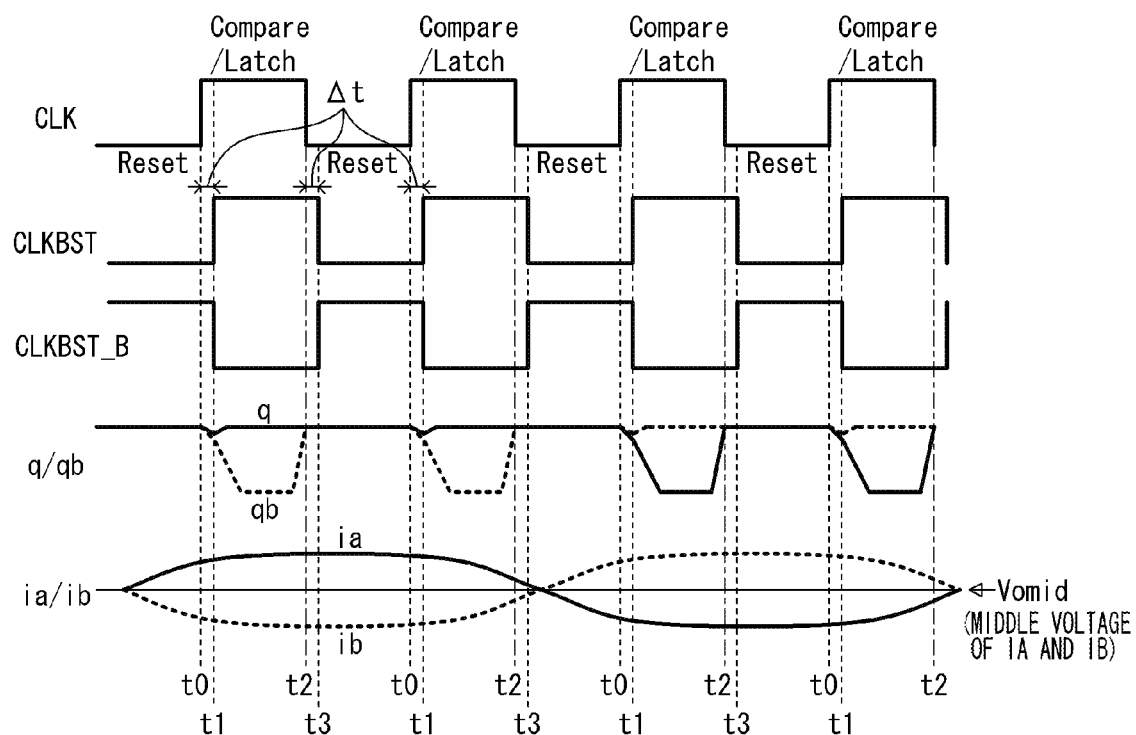
FIG. 3 is a timing diagram for explaining the operations of the dynamic comparators according to the first and the second embodiments.

Next, a sequence of operations of the dynamic comparator will be described referring to the FIGS. 1A and 3. FIG. 3 is a timing diagram showing the clock signals CLK and CLKBST, the outputs q and qb of the comparator, and the voltages of the positive and the negative terminals ia and ib of the differential input signal pair.

When the clock signal CLK is Low (during t2–t0), the PMOS transistors m4a and m4b turn on, and the NMOS transistors m2a and m2b turn off. Thus, the positive feedback section 20 ceases to operate, thereby causing the output terminals q and qb to be pulled up to High, and be reset. At this time, since the NMOS transistors m2a and m2b turn off, the current paths are disconnected, and thus no current flows through the positive feedback section 20 or the input transistor section 10 (reset state). During times t3–t0, since the clock signal CLKBST is also Low, and the NMOS transistors mn2a and mn2b turn off, no current flows through the fast inverter 100, either.

At time t0, the clock signal CLK transitions from Low to High, and thus the PMOS transistors m4a and m4b turn off, and the NMOS transistors m2a and m2b turn on. Thus, the positive feedback section 20 can operate. When the clock signal CLK transitions from Low to High, drain voltages of the NMOS transistors m0a and m0b of the input transistor section 10 are generated depending on the gate terminal voltages of the NMOS transistors m0a and m0b (the voltages of the positive and the negative terminals ia and ib of the differential input signal pair). That is, the NMOS transistors m0a and m0b of the input transistor section 10 compare between the voltages of the positive and the negative terminals ia and ib of the differential input signal pair, and output the result of comparison to the positive feedback section 20. The positive feedback section 20 provides positive feedback to the differential voltage of the drain voltages of the NMOS transistors m0a and m0b in order to amplify the voltages of the output terminals q and qb each to the power supply voltage VDD (i.e., High) or the reference voltage VSS (i.e., Low).

Figure 6:
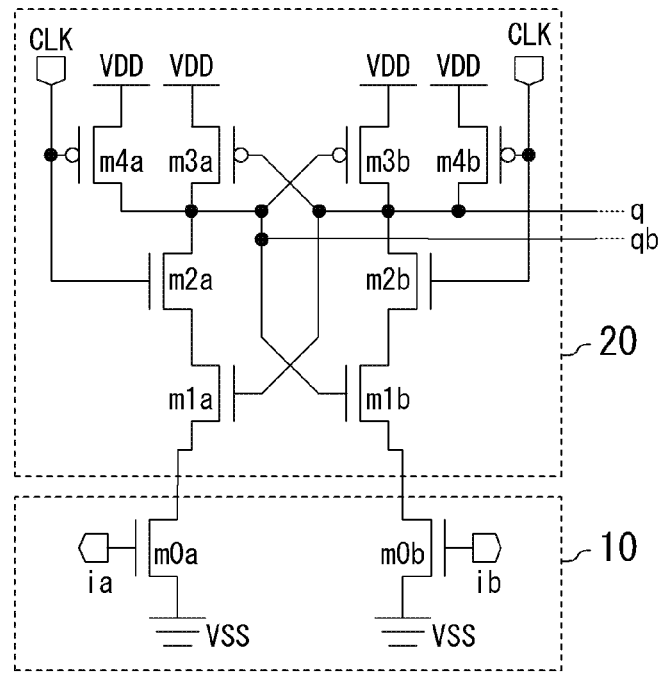
FIG. 6 is a diagram illustrating an example configuration of a conventional dynamic comparator.
Figure 7:
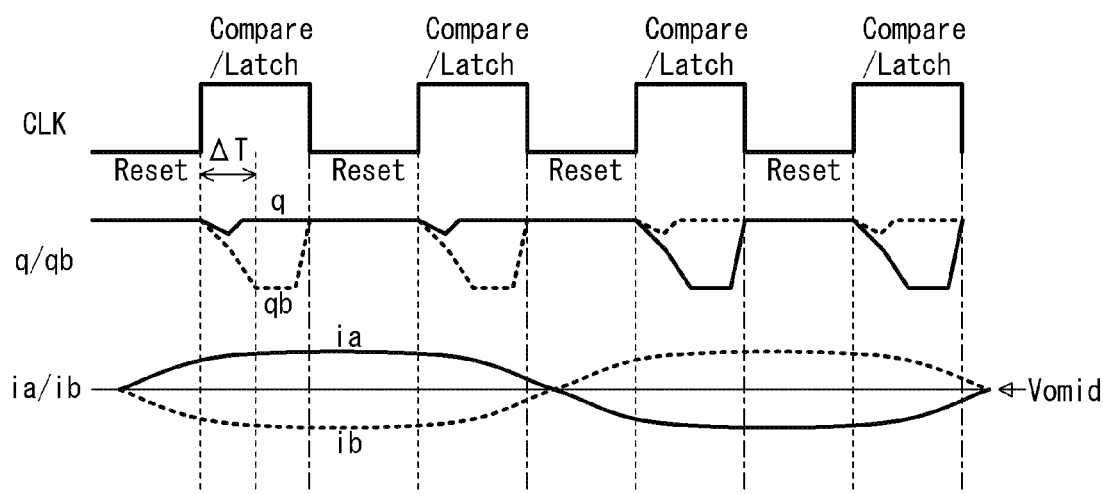
FIG. 7 is a timing diagram for explaining the operation of the dynamic comparator shown in FIG. 6.

After a small delay ($\Delta t$) has passed since the clock signal CLK transitioned from Low to High (time t0), at time t1 (=t0+$\Delta t$), the clock signal CLKBST transitions from Low to High. Here, $\Delta t$ denotes the delay introduced by the clock generation circuit shown in FIG. 1B. It is preferred that $\Delta t$ be set to a time less than that ($\Delta T$ in FIG. 7) required for the positive feedback section 20 to amplify the voltages of the output terminals q and qb each to High (VDD) or Low (VSS) when the dynamic comparator of FIG. 1A does not include the fast inverter 100, that is, in a configuration as shown in FIG. 6.

When the clock signal CLKBST transitions from Low to High, the NMOS transistors mn2a and mn2b turn on, and the fast inverter 100 operates. Since the clock signal CLKBST lags the clock signal CLK, a small potential difference already exists at time t1 between the output terminals q and qb depending on the potential difference between the positive and the negative terminals ia and ib of the differential input signal pair.

Since the gate terminal of the NMOS transistor mn1a is coupled to the output terminal qb, a decrease of the voltage of the output terminal qb causes the drain voltage of the NMOS transistor mn1a to be increased, and eventually causes the voltage of the output terminal q to be increased, while an increase of the voltage of the output terminal qb causes the drain voltage of the NMOS transistor mn1a to be decreased, and eventually causes the voltage of the output terminal q to be decreased.

Meanwhile, since the gate terminal of the NMOS transistor mn1b is coupled to the output terminal q, a decrease of the voltage of the output terminal q causes the drain voltage of the NMOS transistor mn1b to be increased, and eventually causes the voltage of the output terminal qb to be increased, while an increase of the voltage of the output terminal q causes the drain voltage of the NMOS transistor mn1b to be decreased, and eventually causes the voltage of the output terminal qb to be decreased.

That is, positive feedback is provided to the output terminals q and qb. Thus, amplification of a small potential difference between the output terminals q and qb by the positive feedback of the fast inverter 100 other than the positive feedback of the positive feedback section 20 allows the potentials of the output terminals q and qb to vary rapidly.

As described above, due to the fast inverter 100, the dynamic comparator according to the first embodiment can reduce an increase in power consumption, and can improve the speed of a comparison operation of the comparator.

It should be understood that, in the dynamic comparator shown in FIG. 1A, the part other than the fast inverter 100, that is, the input transistor section 10 and the positive feedback section 20 are merely by way of example, and that any suitable dynamic comparator which operates in synchronism with the clock signals would fall within the scope of the present invention, thus the configuration thereof is not limited to that shown in FIG. 1A.

In addition, although FIG. 1B shows a configuration in which the two inverters INV1 and INV2 are cascaded as an example configuration of the buffer circuit BUF, the configuration of the buffer circuit BUF is not limited thereto, and any configuration may be used as long as the circuit provides a function to delay the clock signal CLKBST with respect to the clock signal CLK, such as a configuration in which an even numbers (four, six, eight, . . . ) of inverters are cascaded.

Second Embodiment

Figure 2A:
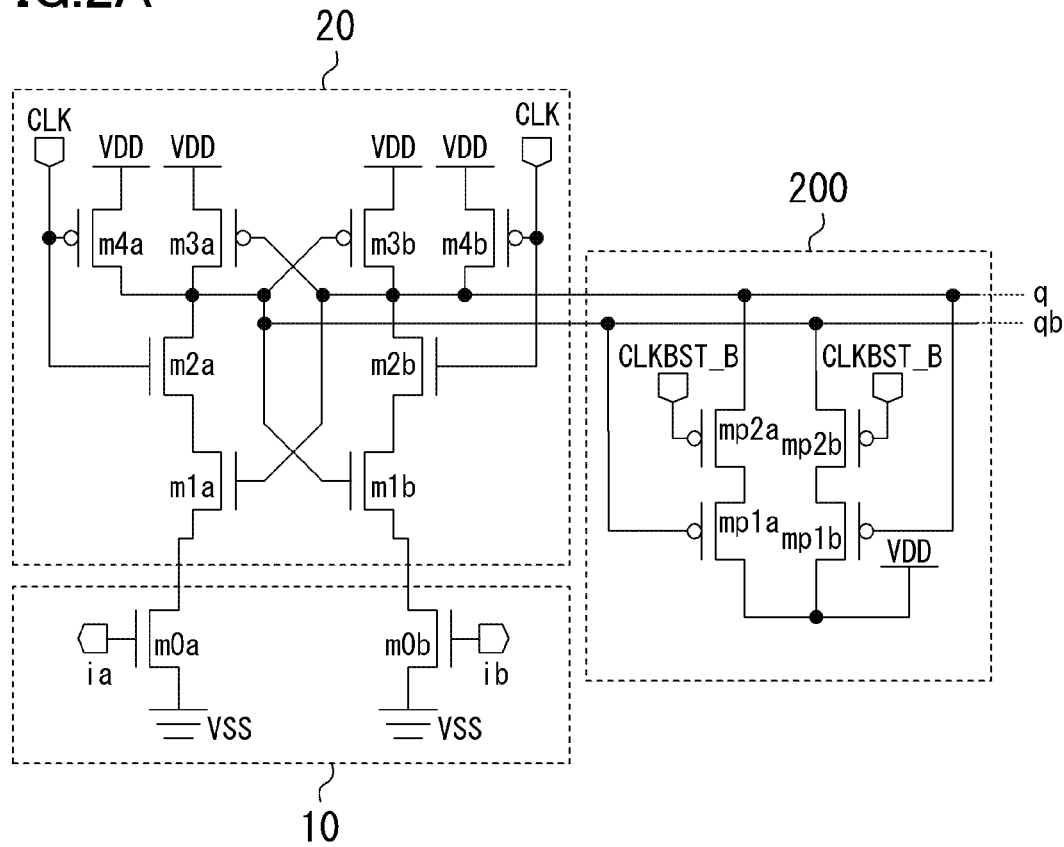
FIG. 2A is a diagram illustrating a configuration of a dynamic comparator according to the second embodiment.

FIG. 2A illustrates a configuration of a dynamic comparator according to the second embodiment. This dynamic comparator includes a fast inverter 200 instead of the fast inverter 100 of FIG. 1A. The other components are the same or similar to those of the dynamic comparator shown in FIG. 1A.

The fast inverter 200 includes PMOS transistors mp1a, mp1b, mp2a, and mp2b. The gate terminal of the PMOS transistor mp1a is coupled to the output terminal qb; the source terminal is coupled to the power supply VDD; and the drain terminal is coupled to the source terminal of the PMOS transistor mp2a. The gate terminal of the PMOS transistor mp2a is coupled to a clock signal CLKBST_B; and the drain terminal is coupled to the output terminal q. The gate terminal of the PMOS transistor mp1b is coupled to the output terminal q; the source terminal is coupled to the power supply VDD; and the drain terminal is coupled to the source terminal of the PMOS transistor mp2b. The gate terminal of the PMOS transistor mp2b is coupled to the clock signal CLKBST_B; and the drain terminal is coupled to the output terminal qb.

Figure 2B:
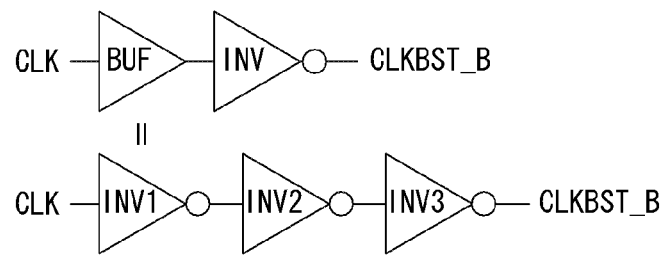
FIG. 2B is a diagram illustrating an example configuration of the clock generation circuit.

FIG. 2B is a diagram illustrating an example configuration of the clock generation circuit for generating a clock signal of the dynamic comparator of FIG. 2A. The clock generation circuit, having a configuration in which a buffer circuit BUF and an inverter INV are cascaded, provides the clock signal CLK to the input of the buffer circuit BUF, and obtains the clock signal CLKBST_B having an opposite phase with respect to the clock signal CLK. Alternatively, the clock generation circuit can be implemented by cascading inverters INV1, INV2, and INV3. Thus, the clock signal CLKBST_B has an opposite phase and a delay ($\Delta t$) with respect to the clock signal CLK.

Next, a sequence of operations of the dynamic comparator will be described referring to the FIGS. 2A and 3. FIG. 3 is a timing diagram showing the clock signals CLK and CLKBST_B, the outputs q and qb of the comparator, and the voltages of the positive and the negative terminals ia and ib of the differential input signal pair.

When the clock signal CLK is Low (during t2–t0), PMOS transistors m4a and m4b turn on, and the NMOS transistors m2a and m2b turn off. Thus, the positive feedback section 20 ceases to operate, thereby causing the output terminals q and qb to be pulled up to High, and be reset. At this time, since the NMOS transistors m2a and m2b turn off, the current paths are disconnected, and thus no current flows through the positive feedback section 20 or the input transistor section 10 (reset state). During times t3–t0, since the clock signal CLKBST_B is High, and the PMOS transistors mp2a and mp2b turn off, no current flows through the fast inverter 200, either.

At time t0, the clock signal CLK transitions from Low to High, and thus the PMOS transistors m4a and m4b turn off, and the NMOS transistors m2a and m2b turn on. Thus, the positive feedback section 20 can operate. When the clock signal CLK transitions from Low to High, drain voltages of the NMOS transistors m0a and m0b of the input transistor section 10 are generated depending on the gate terminal voltages of the NMOS transistors m0a and m0b (the voltages of the positive and the negative terminals ia and ib of the differential input signal pair). That is, the NMOS transistors m0a and m0b of the input transistor section 10 compare between the voltages of the positive and the negative terminals ia and ib of the differential input signal pair, and output the result of comparison to the positive feedback section 20. The positive feedback section 20 provides positive feedback to the differential voltage of the drain voltages of the NMOS transistors m0a and m0b in order to amplify the voltages of the output terminals q and qb each to the power supply voltage VDD (i.e., High) or the reference voltage VSS (i.e., Low).

After a small delay ($\Delta t$) has passed since the clock signal CLK transitioned from Low to High (time t0), at time t1 (=t0+$\Delta t$), the clock signal CLKBST_B transitions from High to Low. Here, $\Delta t$ denotes the delay introduced by the clock generation circuit shown in FIG. 2B. It is preferred that $\Delta t$ be set to a time less than that ($\Delta T$ in FIG. 7) required for the positive feedback section 20 to amplify the voltages of the output terminals q and qb each to High (VDD) or Low (VSS) when the dynamic comparator of FIG. 2A does not include the fast inverter 200, that is, in a configuration as shown in FIG. 6.

When the clock signal CLKBST_B transitions from High to Low, the PMOS transistors mp2a and mp2b turn on, and the fast inverter 200 operates. Since the clock signal CLKBST_B lags the clock signal CLK, a small potential difference already exists at time t1 between the output terminals q and qb depending on the potential difference between the positive and the negative terminals ia and ib of the differential input signal pair.

Since the gate terminal of the PMOS transistor mp1a is coupled to the output terminal qb, a decrease of the voltage of the output terminal qb causes the drain voltage of the PMOS transistor mp1a to be increased, and eventually causes the voltage of the output terminal q to be increased, while an increase of the voltage of the output terminal qb causes the drain voltage of the PMOS transistor mp1a to be decreased, and eventually causes the voltage of the output terminal q to be decreased.

Meanwhile, since the gate terminal of the PMOS transistor mp1b is coupled to the output terminal q, a decrease of the voltage of the output terminal q causes the drain voltage of the PMOS transistor mp1b to be increased, and eventually causes the voltage of the output terminal qb to be increased, while an increase of the voltage of the output terminal q causes the drain voltage of the PMOS transistor mp1b to be decreased, and eventually causes the voltage of the output terminal qb to be decreased.

That is, positive feedback is provided to the output terminals q and qb. Thus, amplification of a small potential difference between the output terminals q and qb by the positive feedback of the fast inverter 200 other than the positive feedback of the positive feedback section 20 allows the potentials of the output terminals q and qb to vary rapidly.

As described above, due to the fast inverter 200, the dynamic comparator according to the second embodiment can reduce an increase in power consumption, and can improve the speed of a comparison operation of the comparator.

It should be understood that, in the dynamic comparator shown in FIG. 2A, the part other than the fast inverter 200, that is, the input transistor section 10 and the positive feedback section 20 are merely by way of example, and that any suitable dynamic comparator which operates in synchronism with the clock signals would fall within the scope of the present invention, thus the configuration thereof is not limited to that shown in FIG. 2A.

In addition, although FIG. 2B shows a configuration in which the three inverters INV1, INV2, and INV3 are cascaded as an example configuration of the clock generation circuit, the configuration of the clock generation circuit is not limited thereto, and any configuration may be used as long as the circuit provides a function to provide the clock signal CLKBST_B having an opposite phase and a delay with respect to the clock signal CLK, such as a configuration in which an odd numbers (five, seven, . . . ) of inverters are cascaded.

Third Embodiment

Figure 4:
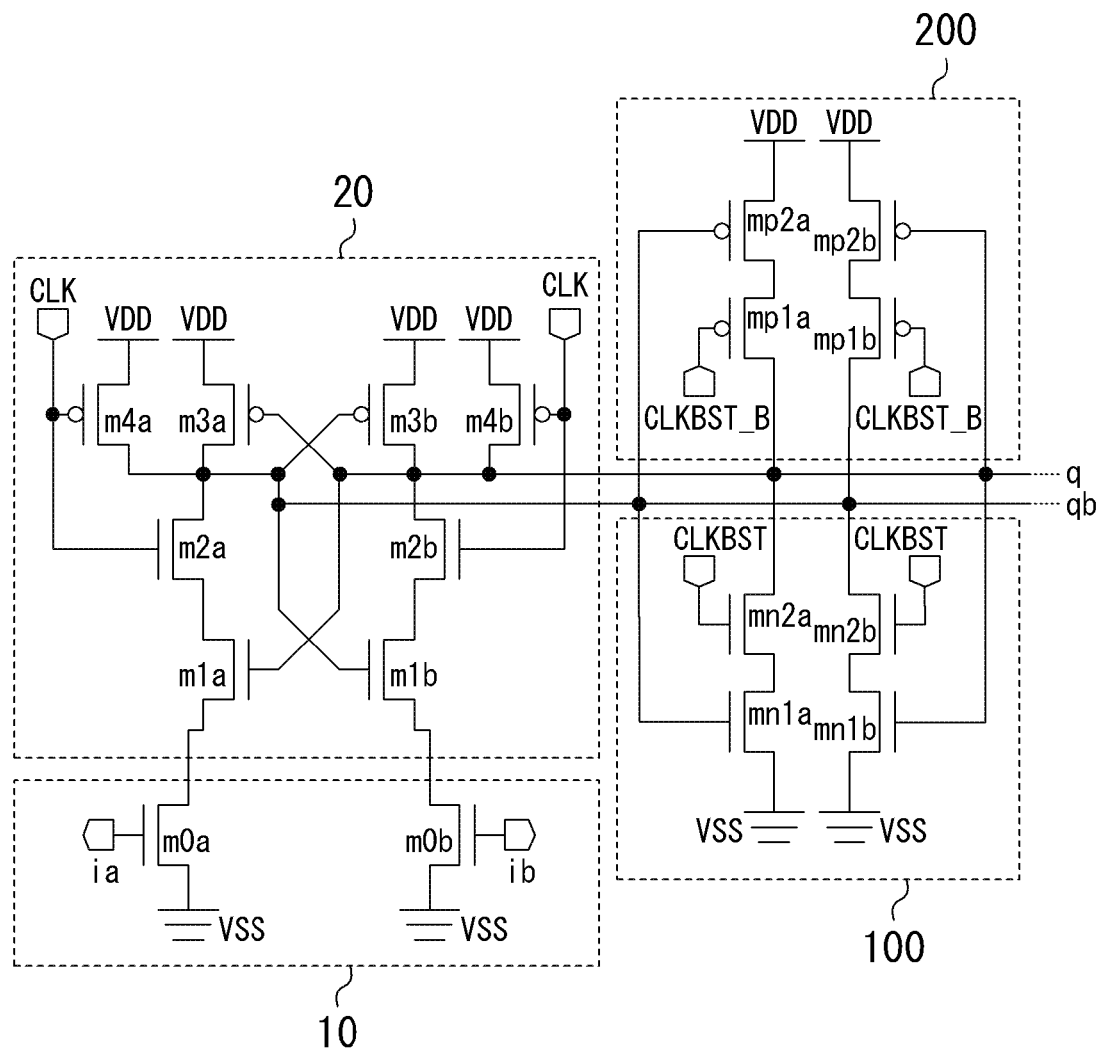
FIG. 4 is a diagram illustrating a configuration of a dynamic comparator according to the third embodiment.

FIG. 4 illustrates a configuration of a dynamic comparator according to the third embodiment. This dynamic comparator includes the fast inverter 200 shown in FIG. 2A in addition to the configuration of the dynamic comparator shown in FIG. 1A.

The fast inverters 100 and 200 provide the same or similar functions as described with respect to the first and the second embodiments, and can coexist as shown in FIG. 4. Therefore, the dynamic comparator of this embodiment including both the fast inverters 100 and 200 also provides a similar function to those of the dynamic comparators shown in FIGS. 1A and 2A. Moreover, since in the dynamic comparator of this embodiment, the NMOS transistors mn1a, mn1b, mn2a, and mn2b of the fast inverter 100 and the PMOS transistors mp1a, mp1b, mp2a, and mp2b of the fast inverter 200 operate in a complementary manner, the speed of a comparison operation of the comparator can be improved in comparison with the dynamic comparators shown in FIGS. 1A and 2A.

Fourth Embodiment

Figure 5:
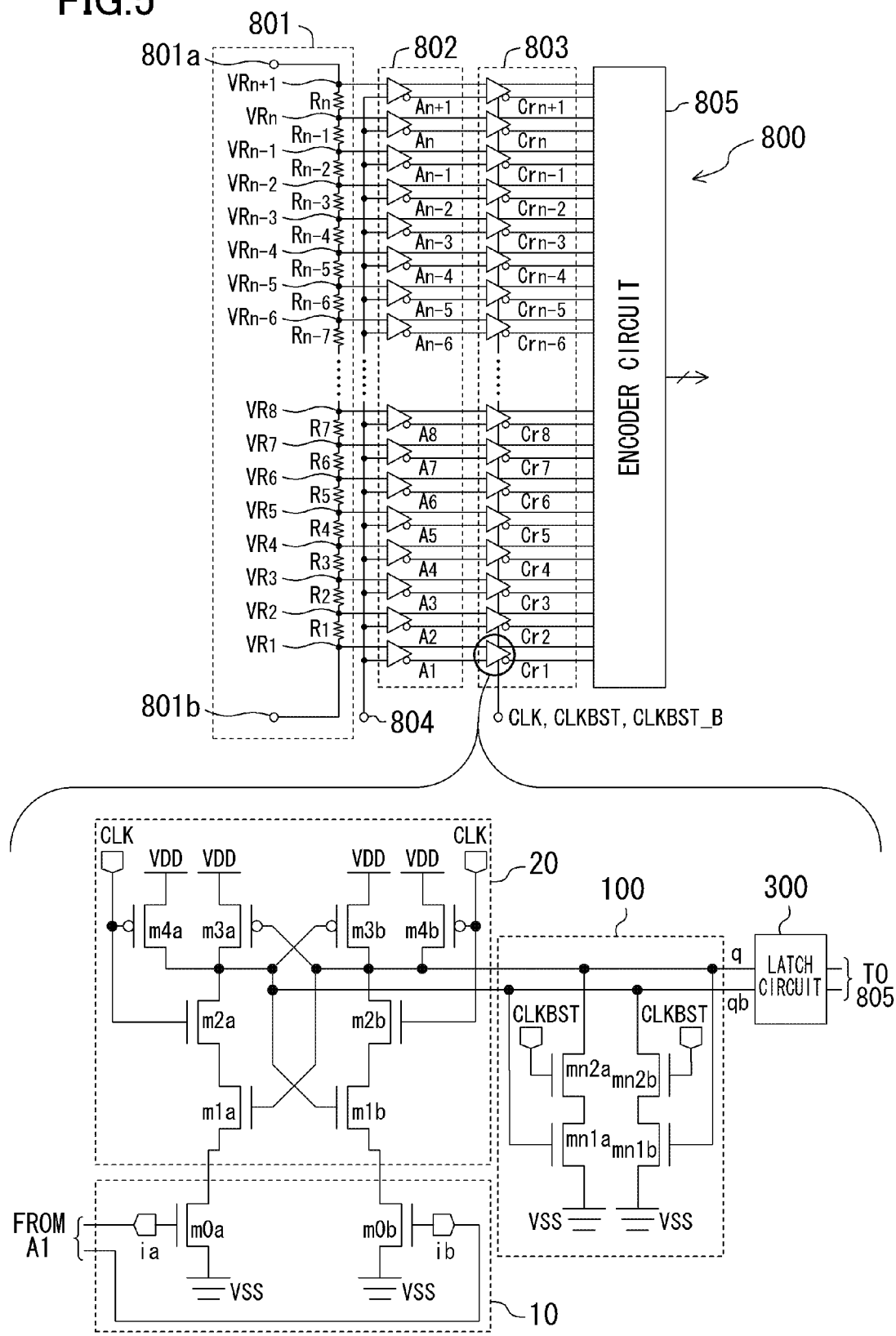
FIG. 5 is a diagram illustrating a configuration of an ADC according to the fourth embodiment.

The dynamic comparators according to the first through the third embodiments can be used, for example, in a parallel ADC. An example thereof is shown in FIG. 5. FIG. 5 shows an example in which the dynamic comparators of the first embodiment (FIG. 1A) are used in an example parallel ADC 800. The dynamic comparator of the first embodiment is used for each of comparison circuits $Cr_1$-$Cr_{n+1}$ of a comparison circuit column 803 of the ADC 800. FIG. 5 representatively illustrates a configuration when used in the comparison circuit $Cr_1$. Thus, using the dynamic comparators of the first embodiment in the ADC 800 allows the operational speed of the ADC 800 to be increased. Usage of the dynamic comparators of the second and the third embodiments also provides similar advantages.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

A comparator according to any of the example embodiments of the present invention can reduce an increase in power consumption and circuit area, and can improve the operational speed of the comparator; thus, usage of the comparators for an ADC can provide an ADC having reduced power consumption, an improved operational speed, and a reduced area.

What is claimed is:

1. A comparator comprising:
a comparing circuit configured to output a pair of results of comparison between a first voltage and a second voltage which constitute input differential signals;
a first positive feedback circuit configured to operate in synchronism with a first clock signal, to amplify the pair of results from the comparing circuit, and to output a pair of amplified results to an output node pair; and
a second positive feedback circuit configured to operate in synchronism with a second clock signal, and to provide positive feedback to the output node pair,
wherein the second positive feedback circuit comprises:
a first circuit for receiving a signal of a first node of the output node pair and outputting a first output to a second node of the output node pair; and
a second circuit for receiving a signal of the second node of the output pair and outputting a second output to the first node of the output node pair.

2. The comparator of claim 1, wherein the second clock signal lags the first clock signal.

3. The comparator of claim 1, wherein:
the second positive feedback circuit includes a first, a second, a third, and a fourth NMOS transistors,
the first circuit includes the first and second NMOS transistors and the second circuit includes the third and fourth NMOS transistors,
a gate of the first NMOS transistor is coupled to the first node of the output node pair, a source is coupled to a reference potential, and a drain is coupled to a source of the second NMOS transistor,
a gate of the second NMOS transistor is coupled to the second clock signal, and a drain is coupled to the second node of the output node pair,
a gate of the third NMOS transistor is coupled to the second node of the output node pair, a source is coupled to the reference potential, and a drain is coupled to a source of the fourth NMOS transistor, and
a gate of the fourth NMOS transistor is coupled to the second clock signal, and a drain is coupled to the first node of the output node pair.

4. The comparator of claim 1, wherein:
the second positive feedback circuit includes a first, a second, a third, and a fourth PMOS transistors,
the first circuit includes the first and second PMOS transistors and the second circuit includes the third and fourth PMOS transistors,
a gate of the first PMOS transistor is coupled to the first node of the output node pair, a source is coupled to a power supply potential, and a drain is coupled to a source of the second PMOS transistor,
a gate of the second PMOS transistor is coupled to the second clock signal, and a drain is coupled to the second node of the output node pair,
a gate of the third PMOS transistor is coupled to the second node of the output node pair, a source is coupled to the power supply potential, and a drain is coupled to a source of the fourth PMOS transistor, and
a gate of the fourth PMOS transistor is coupled to the second clock signal, and a drain is coupled to the first node of the output node pair.

5. The comparator of claim 1, wherein:
the second positive feedback circuit includes:
a first, a second, a third, and a fourth NMOS transistors, and
a first, a second, a third, and a fourth PMOS transistors,
the first circuit includes the first and second NMOS transistors and the first and second PMOS transistors, and the second circuit includes the third and fourth NMOS transistors and the third and fourth PMOS transistors,
a gate of the first NMOS transistor is coupled to the first node of the output node pair, a source is coupled to a reference potential, and a drain is coupled to a source of the second NMOS transistor,
a gate of the second NMOS transistor is coupled to the second clock signal, and a drain is coupled to the second node of the output node pair,
a gate of the third NMOS transistor is coupled to the second node of the output node pair, a source is coupled to the reference potential, and a drain is coupled to a source of the fourth NMOS transistor,
a gate of the fourth NMOS transistor is coupled to the second clock signal, and a drain is coupled to the first node of the output node pair,
a gate of the first PMOS transistor is coupled to the first node of the output node pair, a source is coupled to a power supply potential, and a drain is coupled to a source of the second PMOS transistor,
a gate of the second PMOS transistor is coupled to a third clock signal, which is an inverted signal of the second clock signal, and a drain is coupled to the second node of the output node pair,
a gate of the third PMOS transistor is coupled to the second node of the output node pair, a source is coupled to the power supply potential, and a drain is coupled to a source of the fourth PMOS transistor, and
a gate of the fourth PMOS transistor is coupled to the third clock signal, and a drain is coupled to the first node of the output node pair.

6. An analog-to-digital converter, comprising: the comparator of claim 1.

7. A comparator comprising:
a comparing circuit configured to output a result of comparison between a first voltage and a second voltage which constitute an input differential signal;
a first positive feedback circuit configured to operate in synchronism with a first clock signal, to amplify the result from the comparing circuit, and to output the amplified result to an output node pair; and
a second positive feedback circuit configured to operate in synchronism with a second clock signal, and to provide positive feedback to the output node pair, wherein:
the second positive feedback circuit includes a first, a second, a third, and a fourth NMOS transistors,
a gate of the first NMOS transistor is coupled to one of the output node pair, a source is coupled to a reference potential, and a drain is coupled to a source of the second NMOS transistor,
a gate of the second NMOS transistor is coupled to the second clock signal, and a drain is coupled to the other one of the output node pair,
a gate of the third NMOS transistor is coupled to the other one of the output node pair, a source is coupled to the reference potential, and a drain is coupled to a source of the fourth NMOS transistor, and
a gate of the fourth NMOS transistor is coupled to the second clock signal, and a drain is coupled to the one of the output node pair.

8. The comparator of claim 7, wherein:
the second positive feedback circuit further includes a first, a second, a third, and a fourth PMOS transistors,
a gate of the first PMOS transistor is coupled to the one of the output node pair, a source is coupled to a power supply potential, and a drain is coupled to a source of the second PMOS transistor,
a gate of the second PMOS transistor is coupled to the second clock signal, and a drain is coupled to the other one of the output node pair,
a gate of the third PMOS transistor is coupled to the other one of the output node pair, a source is coupled to the power supply potential, and a drain is coupled to a source of the fourth PMOS transistor, and
a gate of the fourth PMOS transistor is coupled to the second clock signal, and a drain is coupled to the one of the output node pair.

9. An analog-to-digital converter, comprising: the comparator of claim 7.

10. A comparator comprising:
a comparing circuit configured to output a result of comparison between a first voltage and a second voltage which constitute an input differential signal;
a first positive feedback circuit configured to operate in synchronism with a first clock signal, to amplify the result from the comparing circuit, and to output the amplified result to an output node pair; and
a second positive feedback circuit configured to operate in synchronism with a second clock signal, and to provide positive feedback to the output node pair, wherein:
the second positive feedback circuit includes a first, a second, a third, and a fourth PMOS transistors,
a gate of the first PMOS transistor is coupled to one of the output node pair, a source is coupled to a power supply potential, and a drain is coupled to a source of the second PMOS transistor,
a gate of the second PMOS transistor is coupled to the second clock signal, and a drain is coupled to the other one of the output node pair,
a gate of the third PMOS transistor is coupled to the other one of the output node pair, a source is coupled to the power supply potential, and a drain is coupled to a source of the fourth PMOS transistor, and
a gate of the fourth PMOS transistor is coupled to the second clock signal, and a drain is coupled to the one of the output node pair.

11. An analog-to-digital converter, comprising: the comparator of claim 10.

* * * * *